United States Patent
Arnhold et al.

(10) Patent No.: US 11,252,830 B2
(45) Date of Patent: Feb. 15, 2022

(54) EXPLOSION-PROOF HOUSING WITH INNER PRESSURE RELIEF

(71) Applicant: R. Stahl Schaltgeräte GmbH, Waldenburg (DE)

(72) Inventors: Thorsten Arnhold, Pfedelbach (DE); Clife Hermanowski, Seckach (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 148 days.

(21) Appl. No.: 16/617,886

(22) PCT Filed: May 22, 2018

(86) PCT No.: PCT/EP2018/063338
§ 371 (c)(1),
(2) Date: Nov. 27, 2019

(87) PCT Pub. No.: WO2018/219712
PCT Pub. Date: Dec. 6, 2018

(65) Prior Publication Data
US 2020/0113075 A1    Apr. 9, 2020

(30) Foreign Application Priority Data
Jun. 1, 2017 (DE) .................... 10 2017 112 153.6

(51) Int. Cl.
*F41H 5/24* (2006.01)
*H05K 5/02* (2006.01)

(52) U.S. Cl.
CPC ......... *H05K 5/0217* (2013.01); *H05K 5/0213* (2013.01)

(58) Field of Classification Search
CPC . F41H 5/24; H02B 1/28; H05K 5/068; H05K 5/0213; A62C 4/00
See application file for complete search history.

(56) References Cited

U.S. PATENT DOCUMENTS

| 2,789,238 A | 4/1957 | Staak |
| 4,180,177 A | 12/1979 | Gunderman et al. |
| 4,484,690 A | 11/1984 | Nash |
| 2015/0036310 A1* | 2/2015 | Karandikar .......... H05K 5/0213 361/837 |

(Continued)

FOREIGN PATENT DOCUMENTS

| DE | 261 063 A3 | 10/1988 |
| DE | 198 60 383 B4 | 6/2005 |

(Continued)

*Primary Examiner* — J. Woodrow Eldred
(74) *Attorney, Agent, or Firm* — Blank Rome LLP

(57) ABSTRACT

A housing arrangement comprising a housing an inner space for accommodating components capable of forming sources of ignition. The housing arrangement further comprises a partial housing arranged in or on the housing and the interior space. The interior space acts as a pressure relief volume. The interior space and the pressure relief volume are connected together via a passage in which a gas-permeable and flame-arresting arrangement is provided. This can be formed from a porous body, for instance, which is gas permeable and acts in a throttling and cooling manner on a gas flow passing through it.

10 Claims, 4 Drawing Sheets

(56) References Cited

U.S. PATENT DOCUMENTS

| | | | |
|---|---|---|---|
| 2015/0060445 A1* | 3/2015 | Mann | B23P 11/005 |
| | | | 220/88.2 |
| 2015/0060465 A1 | 3/2015 | Limbacher et al. | |
| 2018/0097214 A1* | 4/2018 | Ogawa | H01M 50/20 |
| 2018/0105282 A1* | 4/2018 | Tweet | A62C 4/00 |

FOREIGN PATENT DOCUMENTS

| | | |
|---|---|---|
| DE | 10 2013 109 259 A1 | 3/2015 |
| DE | 10 2014 206 433 B3 | 8/2015 |
| DE | 10 2014 116 149 A1 | 5/2016 |
| DE | 10 2015 206 355 A1 | 10/2016 |
| DE | 10 2010 016 782 B4 | 12/2016 |
| EP | 0 592 757 A1 | 4/1994 |
| RU | 2 140 686 C1 | 10/1999 |
| RU | 162 661 U1 | 6/2016 |
| WO | WO 2013/160070 A1 | 10/2013 |

* cited by examiner

EXPLOSION-PROOF HOUSING WITH INNER PRESSURE RELIEF

CROSS-REFERENCE TO RELATED APPLICATIONS

This is a national stage of International Application No. PCT/EP2018/063338 filed May 22, 2018 which claims priority to German Patent Application No. 10 2017 112 153.6, filed Jun. 1, 2017, the entirety of all of which are incorporated by reference herein.

TECHNICAL FIELD

The subject matter of the invention relates to an explosion-proof housing, in particular a housing consistent with protection class Ex-d.

BACKGROUND

Housings consistent with protection class Ex-d are frequently used in explosive areas. Such housings are robust in that they withstand an ignition of an explosive gas mixture occurring in the housing interior, as well as the pressure increase caused by the subsequently occurring explosion. Furthermore, the housings are designed in such a manner that flames or burning particles acting as ignition sources cannot get to the outside. Should there be gaps, they must have a minimum length and must not exceed a maximum width. Furthermore, housing vents are provided with pressure relief bodies which are also referred to as flame protection filters and prevent an explosion ignited in the housing from reaching the outside in order to ignite an explosive mixture existing in the environment.

Publication DD 261063 A3 describes an example of an explosion-proof housing. The housing illustrated therein comprises a porous body arranged in its interior space, said porous body, for example, consisting of slag wool, glass wool or metal or ceramic with open through-pores or through-gaps. Such a body is intended to lower the explosion pressure by approximately 90%.

Likewise, Publication DE 198 60 386 B4 discloses a housing intended for a display screen that has an interior space which is partially filled with a porous damping material. This material has a plurality of channels in the form of pores and/or gaps, which have a small cross-section and are not closed but continuous. The explosion pressure is to be reduced to only approximately 10 percent of the explosion pressure which would otherwise occur in the empty housing.

Similarly, publication DE 10 2014 206 433 B3 provides the arrangement of a tablet computer in an explosion-proof housing with a glass pane, in which case a damping element of open-pore rock wool, quartz wool or glass wool, metal foam or the like is arranged in the tablet computer.

The so far introduced housing solutions require a damping body having a considerable volume for lowering the explosion pressure, in which case the interior space of the housing is utilized inadequately.

In contrast, publication DE 10 2013 109 259 A1 describes an explosion-proof housing of the protection class consistent with "pressure-proof encapsulation" (Ex-d); in this case, there is provided, in the housing wall of said housing, a porous pressure relief body, through which an explosion pressure built up in the housing can escape toward the outside.

A similar principle is also applied by the housings according to publication U.S. Pat. No. 4,180,177, as well as publication DE 10 2010 016 782 B4.

Furthermore, an advantageous structure of a pressure relief body has been known from publication DE 10 2014 116 149 A1. This pressure relief body comprises several layers of wire mesh with different orientations and mesh widths, in which case these layers have been connected to each other by a sintering process. If such housings are provided in a contrary environment, for example an atmosphere loaded with dust or are directly subjected to the influences of weather, the pressure relief bodies require special protection, for example, against contamination, bacterial contamination, corrosion and/or icing, in the housing openings.

SUMMARY

It is the object of the invention to state a concept for an explosion-proof housing with which it is possible to avoid one or more of the aforementioned disadvantages.

This object is achieved with the explosion-proof housing arrangement according to Claim 1.

The housing arrangement according to the invention comprises a housing that encloses an interior space that is suitable for the accommodation of components which can form ignition sources. A relief volume is provided in or on the housing. Additionally or alternatively, the relief volume may be arranged, outside or inside, adjoining the interior space. In doing so, at least one passage opening which connects the interior space with the pressure relief volume is provided, in which case a gas-permeable and flame-arresting arrangement is located in this passage opening. Typically, this arrangement is a porous, mechanically stable body with a plurality of pore channels that intersect once or several times, which channels connect to the sides of the body facing away from each other to each other. The pressure relief body may be a porous metal body, porous ceramic body, porous glass body or a sintered body consisting of metal particles, or ceramic particles or of several wire mesh layers which are connected to each other.

The pressure relief body can be glued, welded or also mechanically connected to the wall arrangement, for example by means of a clamp frame, clamp screws or the like. The pressure relief body may be affixed to the housing wall or be placed into the housing wall when the housing wall is being cast.

According to the invention, there is located, on one side of the flame-arresting arrangement, that portion of the interior space, in which the components forming the ignition sources are arranged while, on the other side of the flame-arresting, gas-permeable arrangement, a volume is delimited, which volume is free of components forming ignition sources. For example, the portion of the interior space containing the components may be associated with an explosion-proof housing Ex-d, while the pressure relief volume is configured consistent with another protection class, for example Ex-e. Consequently, it may have openings that are open toward the environment. In any event, however, the gas-permeable, flame-arresting arrangement is not subject to direct environmental influences and thus removed from dust deposits, icing, etc.

The latter applies in particular if the pressure relief volume is formed in a partial housing arranged in the interior space of the housing.

The combination of the gas-permeable and flame-arresting arrangement, for example in the form of a stiff, porous body (for example, a metal net layer sintered body) with a pressure relief volume decreases—compared with damping bodies, as are known from prior art—the volume required by the pressure reduction arrangement. According to the invention, this consists of the gas-permeable, flame-arresting arrangement and the partial housing containing the pressure relief volume. Compared to a porous body of equal size, the latter displays greater absorption capacity. Due to the cooling of the amount of gas passing through the porous body, which causes the cooling due to expansion, the pressure relief volume displays a particularly strong pressure-reducing effect. Likewise, the flow resistance of the free pressure relief volume is clearly lower than the flow resistance inside a porous damping body, which is particularly helpful in reducing the pressure peak after an explosion has been triggered.

BRIEF DESCRIPTION OF THE DRAWINGS

Additional details of advantageous embodiments of the invention are the subject matter of the claims, the description or the drawings. They show in FIG. 1 a schematic sectional representation of an explosion-proof housing with a pressure relief volume and a pressure relief body arranged in between, FIGS. 2 to 5 schematic sectional representations of additional embodiments of explosion-proof housings with a pressure relief volume, FIG. 6 a schematic representation of a double-walled explosion-proof housing having interior wall spaces acting as the pressure relief volume, and FIG. 7 an explosion-proof double-walled housing with a wall volume that is at least partially filled with porous material.

DETAILED DESCRIPTION

Figure 1:
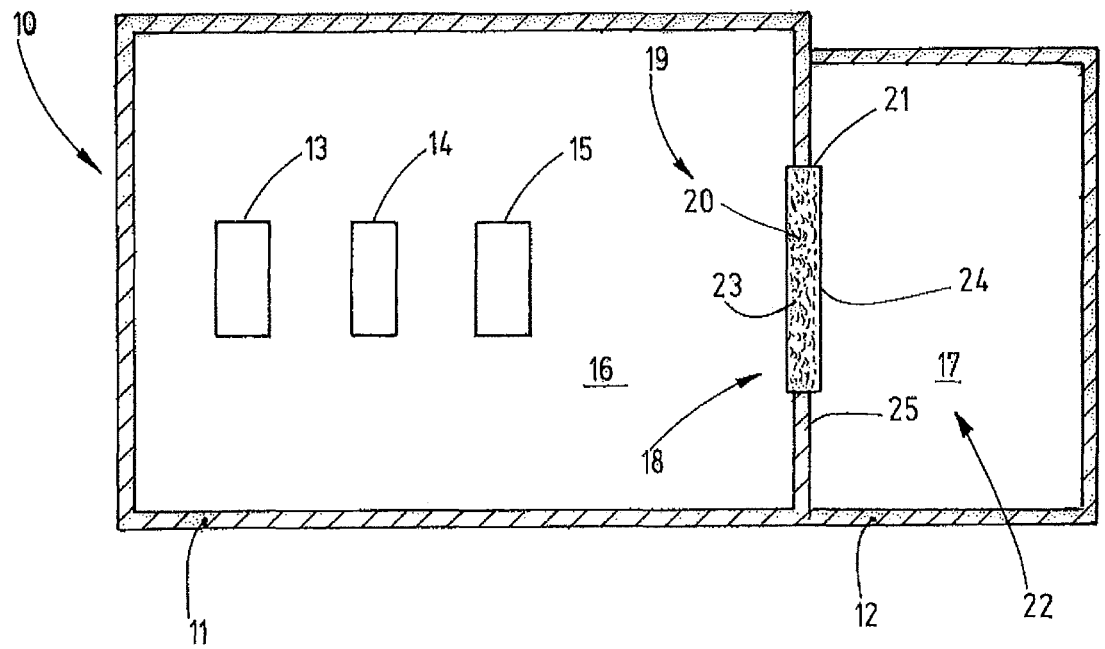

FIG. 1 shows a housing arrangement 10 which comprises a housing 11 and a partial housing 12. The housing 11 contains one or more electrical or other components 13, 14, 15 that are arranged in an interior space 16, which is enclosed by the housing 11 and which can form ignition sources for an explosive gas mixture that may potentially be present there Typically, the housing 11 consists of metal, for example steel or aluminum; however, it may also be formed of a suitable plastic material or plastic compound material. This housing directly adjoins the partial housing 12 that may consist of the same or of a different material. The partial housing 12 also encloses an interior space 17, in which no additional structural components or components, or at least no structural components or components, which can form ignition sources, are arranged. Such components may be, for example, inactive contacts, for example, in the form of electrical connection contacts. In this case, the housing 11 is configured consistent with protection class Ex-d (pressure-resistant encapsulation), for example, which means that each connection between the interior space 16 and the environment is adapted so as to be flame-arresting, and in which case the housing wall of the housing 11 withstands the pressure of an explosion occurring in the interior space 16. In contrast, the partial housing 12 may be adapted for another protection class, for example Ex-e, which means that the interior space 17 contains no elements forming an ignition source.

It is also possible to configure the housing 11, as well as the partial housing 12 so as to meet the same standard, e.g., that of a pressure-resistant encapsulation consistent with (Ex-d). In this case, components that form ignition sources may be present in the housing 11, as well as in the partial housing 12. This is true, in particular, when potential ignition sources present in both interior spaces 16, 17 are not simultaneously active.

The housing 11 has a passage opening 18 on one wall 25, which passage opening connects the interior space 16 to the interior space 17. The wall 25 is an integral part of the housing 11 or of the partial housing 12. A flame-arresting arrangement 19 is provided in or on the passage opening 18, said arrangement being gas permeable and, for example, being formed by a porous body 20. The latter may be a metal foam body, ceramic foam body or a body formed of a wire fabric, wire mesh, wire felt or the like, for example. In particular, the porous body 20 is flexurally rigid and its periphery 21 is connected to the housing wall. Preferably, the connection is without gaps, so that gas flowing through the passage opening 18 cannot bypass the porous body 20.

The so far described housing arrangement 10 can be used in an explosive environment. Should explosive gasses have penetrated into the interior space 16 and, optionally, also 17 through not specifically illustrated gaps or in other ways, these gases may ignite on one of the components 13 to 15 at a random time and lead to an explosion in the interior space 16. The housing 11 has no openings or gaps through which flames or hot particles might escape toward the outside. All joints, gaps and otherwise not gas-tight structures are flame-arresting.

The explosion triggered in the interior space 16 initially leads to a heating and expansion of the existing gas volume, which is accompanied by a pressure increase. However, the flame-arresting arrangement 19 effects a pressure relief in that said arrangement allows the gas stream to transfer from the interior space 16 into the interior space 17. The gasses penetrating through the porous body 20 into the interior space 17 cool by discharging thermal energy on the porous body 20, as well as by expanding, for example, in an adiabatic manner and/or due to the Jules Thomson effect. As a result of this, the interior space 17 is able to absorb a gas volume that is greater than the gas volume which has left the interior space 16 through the passage opening 18. Thus, the interior space 17 forms a highly effective pressure relief volume 22 for the interior space 16.

In addition, the partial housing 12 keeps environmental influences away from the flame-arresting arrangement 19, so that said arrangement is protected, in particular, against dust, pollution, bacterial contamination, icing and similar influences. In particular those environmental influences which can lead to a decrease of the gas permeability of the flame-arresting arrangement 19 are kept away.

The surface 23 facing the interior space 16, as well as the surface 24 facing the pressure relief volume 22, are permanently protected.

Figure 2:
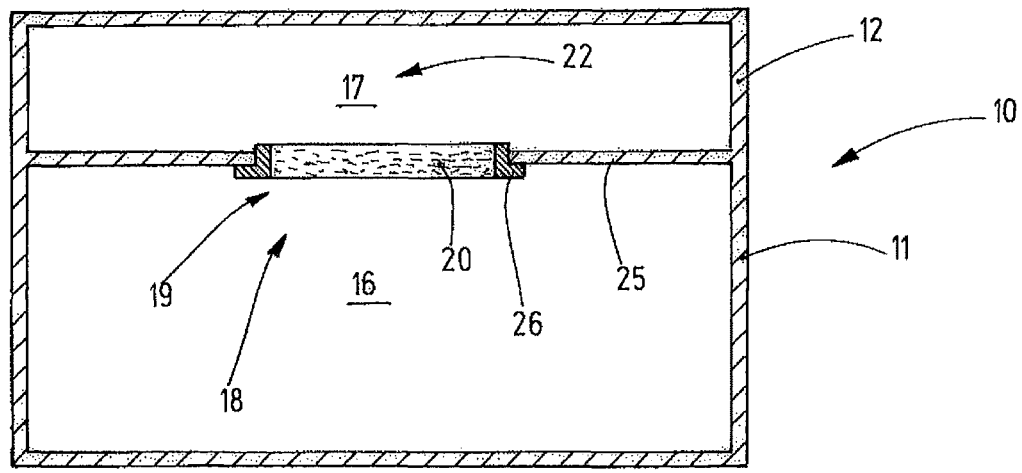

FIG. 2 shows a modified embodiment of the housing arrangement 10, in which the housing 11 and the partial housing 12 are formed by one common housing body. The pressure relief volume 22 is separated from the interior space 16 by an intermediate wall 25 which is an integral component of the housing body and in which the passage opening 18 with the pressure relief arrangement 19 is arranged. The porous body 20 belonging to this pressure relief arrangement, in turn, can be connected in any suitable manner to the periphery of the pressure relief vent 18, for example via a receptacle 26 which is glued, screwed, welded, soldered or otherwise connected to the intermediate wall 25, in which receptacle the porous body 20 is held.

It applies to all embodiments that the interior space 16 of the housing 11 is preferably larger than the interior space 18 of the partial housing 12. Not depicted components which could represent potential ignition sources, may be arranged in the interior space 16. The interior space 17 is preferably free of ignition sources.

Figure 3:
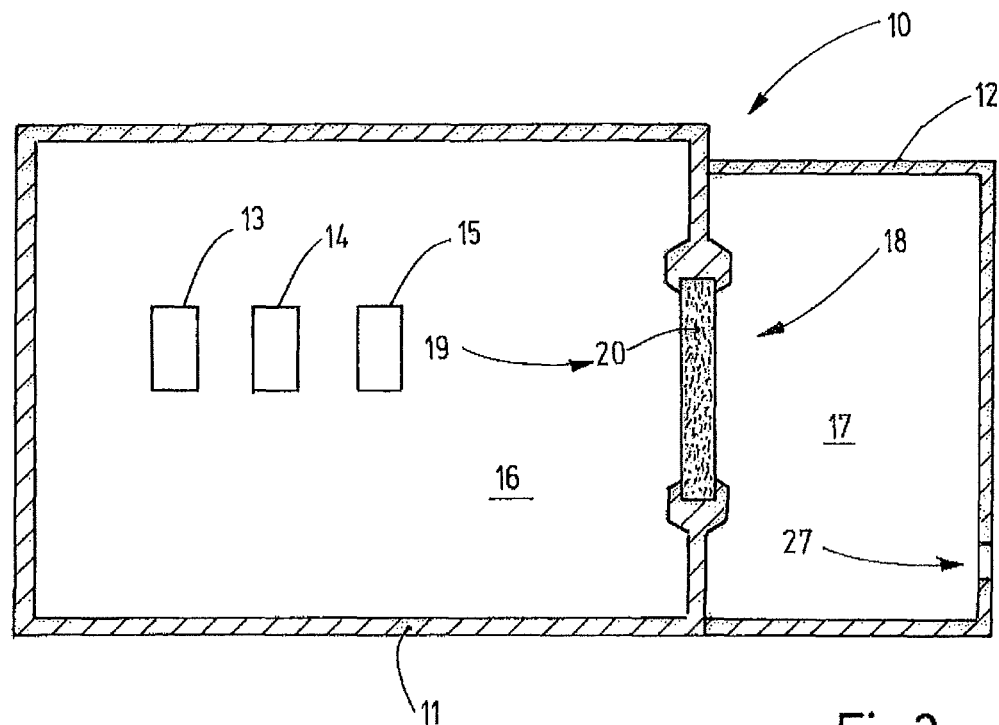

FIG. 3 shows another modification of the housing arrangement 10. The embodiment illustrated there is based on the housing arrangement 10 according to FIG. 1, in which case the partial housing 12 has at least one opening 27 that connects the interior space 17 to the free environment. This opening 27 is not flame-arresting. Therefore, there are no ignition sources in the interior space 17. Any components arranged there are configured in such a manner that no explosion can originate from them. For example, these may be inactive contacts or other means. Components 13 to 15 which form ignition sources are exclusively arranged in the interior space 16.

Only considering the present example—in this embodiment a pressure relief device 19 is provided, in which case the porous body 20 on the periphery of the opening 18 is connected to the material 11 of the housing 11 by casting, for example, in that the porous body 20 is was placed during the casting process of the housing 11 into its casting mold and is partially enclosed by the housing wall material. This type of arrangement of the porous body 20 in or on the wall 25 of the housing 11 can be used in any of the embodiments described hereinabove or hereinafter. This is applicable when the body 20 connects the interior spaces 16, 17 to each other, as well as when the porous body 20 connects the interior space 16 to the environment.

Figure 4:
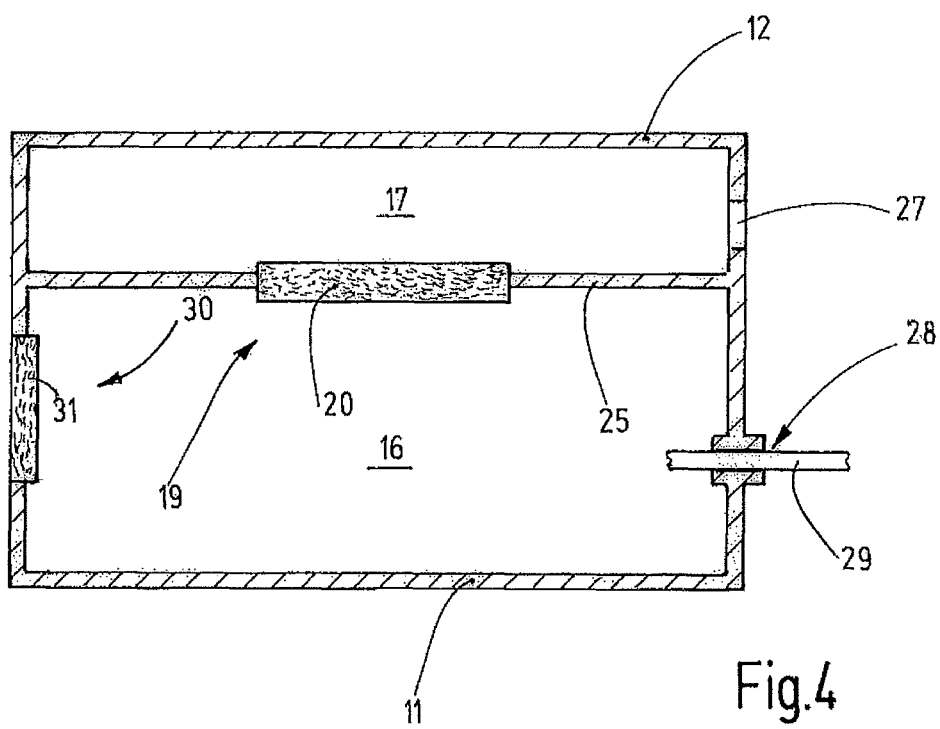

FIG. 4 shows an embodiment with double pressure relief. It shows a housing structure modeled after the housing arrangement 10 as in FIG. 2, in which case the porous body 20 can be fastened in any of the ways described hereinabove in or on the intermediate wall 25. Optionally, the partial space 17 may be connected to the environment via the opening 27.

In order to illustrate the optimal option of the presence of passages or gaps between the interior space 16 and the environment, FIG. 4 shows a passage 28 for a mechanical element, for example a shaft 29. The gap formed between the shaft 29 and the corresponding housing passage 28 is narrow and long and thus flame-arresting. Such or similar arrangements may be provided in all embodiments that are described hereinabove or hereinafter.

The housing 11 may be provided with another pressure relief arrangement 30 that is formed by a porous body 31. It is gas-permeable and flame-arresting. Its composition and structure may correspond to the porous body 20, so that corresponding reference is made regarding its description. Furthermore, this porous body can be connected in any of the aforementioned ways to the housing wall.

In the embodiment according to FIG. 4, the porous body 20 is protected against contamination and atmospheric influences. The additional pressure relief body 30 may be clearly smaller in design and be affixed to a suitable location on the housing, for example on the underside of the housing. As a result of this or as a result of additional measures, e.g., a tearable protective membrane, the pressure relief body can be protected against environmental influences. Such membranes may tear when a gas stream exits and clear the path for said stream. However, the membranes must then be replaced. Due to the pressure relief volume, smaller deflagrations do not lead to the destruction of such a protective membrane, so that a frequent membrane replacement is not required.

Figure 5:
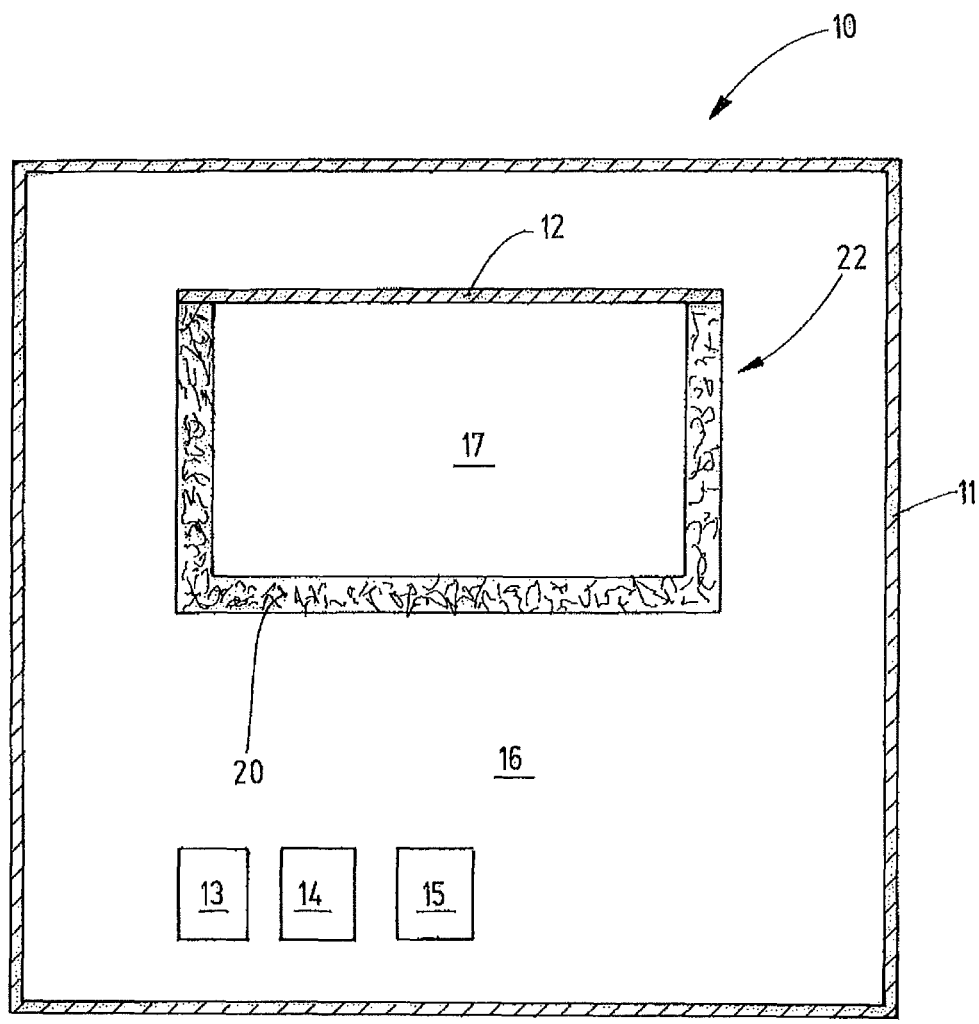

FIG. 5 illustrates another possibility of forming a pressure relief volume 22 in or on the housing 11. In the housing arrangement 10 depicted there, the partial housing 12 is arranged in the interior space 16 and thus completely enclosed by the housing 11. The wall arrangement of the partial housing 11 may be formed completely or partially by the porous body 20, which, accordingly, also delimits the interior space 17, optionally together with the remaining housing wall of the housing 12. The interior space 17 delimited by the interior space 16, said interior space 17 forming the pressure relief volume 22, is again delimited in a flame-arresting manner by the pressure relief body 20. For example, if an explosion is triggered in the interior space 16 on one of the components 13 to 15, this explosion builds up a wave of hot compressed gasses which, when passing through the porous body 20, cool off and thus decrease in volume. Consequently, the pressure relief volume 22 acts as an absorption volume for the effective reduction of pressure peaks in the housing 11.

Figure 6:
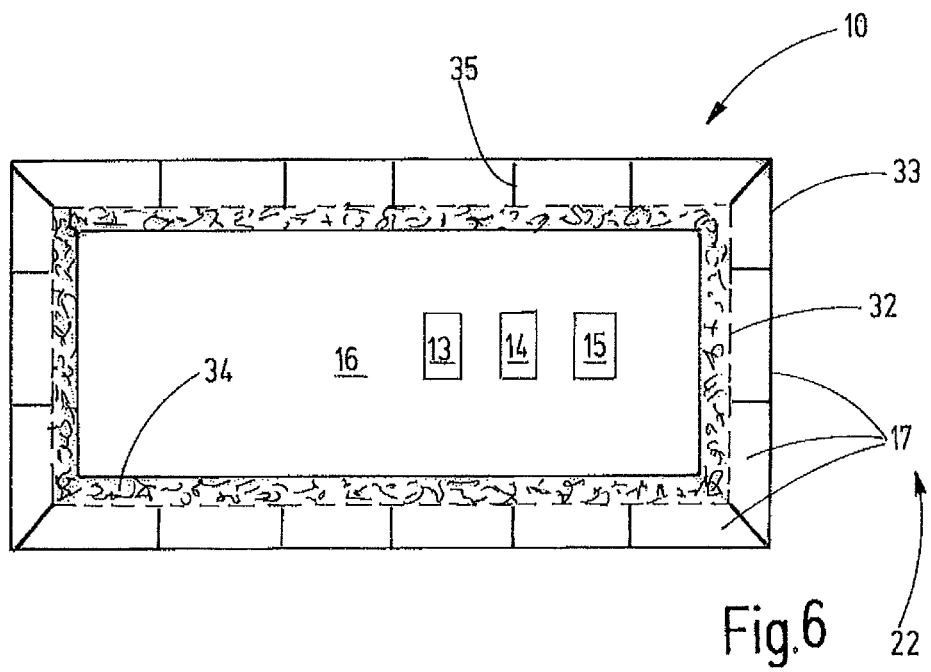

As shown by FIG. 6, it is also possible to design the housing arrangement 10 as a double-walled housing, in which case the interior space 16 enclosed by the inner housing wall 32 can accommodate components 13, 14, 15, which form sources of ignition. Between the inner housing wall 32 and the outer housing wall 33, there are formed one or more chambers, whose interior spaces 17—together—form the pressure relief volume 22.

The inner wall 32 may be provided with a number of openings, so that all the chambers existing in the housing 32, 33 are in open communication with the interior space 16. Again, pressure relief bodies may be arranged in the openings or, as shown by FIG. 6, a flame-arresting lining 34 can prevent the transmission of flame into the chambers 17. In doing so, the flame-arresting lining preferably is formed by one or more flame-arresting bodies, for example metal foam, metal felt, metal fabric, metal sintered bodies, ceramic sintered bodies, ceramic fiber bodies and the like. Due to the cooling effect and expansion cooling of the gas passing through the lining 34, the pressure relief volume 22 acts as an absorption volume in order to prevent pressure peaks.

At the same time, the double-walled housing allows for a particularly light-weight and robust housing design. Additional openings for the passage of cables or for mechanically movable elements may be arranged on the housing arrangement 10 so as to break through the walls 32, 33. However, these openings are also configured to be flame-arresting as is usual in Ex-d housings.

Figure 7:
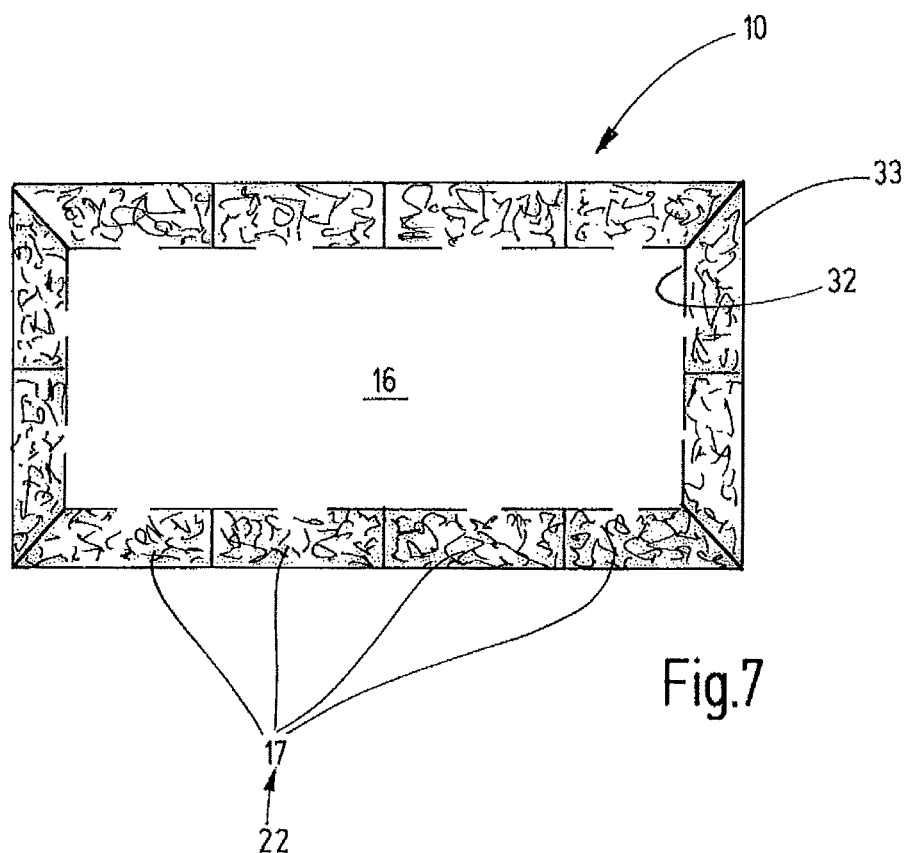

FIG. 7 shows a modified embodiment of the housing arrangement 10. Again, this is a two-shell housing design with an interior wall 32 and an exterior wall 33, between which the individual chambers are arranged, said chambers—together—forming the interior space 17 and thus the pressure relief volume 22. The inner housing wall 32 is provided with openings so that, preferably, each of the chambers communicates with the interior space 16. One or more chambers are filled—at least partially or also completely—with a porous material to effect a cooling and thus a reduction of volume of the explosion wave moving in the interior space 17.

The housing arrangement 10 according to the invention comprises an interior space 16 for accommodating components 13, 14, 15 which can form sources of ignition. The housing arrangement 10 further comprises a partial housing 12, which is arranged in or on the housing 11 and the interior space 17 of which acts as a pressure relief volume 22. The two interior spaces 16, 17 are connected together via a passage opening 18, in which a gas-permeable and flame-arresting arrangement 19 is provided. This can be formed from a porous body 20, for instance, which is gas-permeable and acts in a throttling and cooling manner on a gas flow passing through said porous body.

REFERENCE SIGNS

| | |
|---|---|
| 10 | Housing arrangement |
| 11 | Housing |
| 12 | Partial housing |
| 13-15 | Components |
| 16 | Interior space of the housing 11 |
| 17 | Interior space of the partial housing 12 |
| 18 | Passage opening in the wall of the housing 11 |
| 19 | Flame-arresting arrangement |
| 20 | Porous body |
| 21 | Periphery of the body 20 |
| 22 | Pressure relief volume |
| 23 | Surface of the body 20, said surface facing the interior space 16 |
| 24 | Surface of the body 20, said surface facing the interior space 17 |
| 25 | Intermediate wall |
| 26 | Receptacle |
| 27 | Opening |
| 28 | Passage |
| 29 | Shaft |
| 30 | Pressure relief arrangement |
| 31 | Porous body |
| 32 | Inner housing wall |
| 33 | Outer housing wall |
| 34 | Flame-arresting lining |

The invention claimed is:

1. A housing arrangement of protection class ex-d, the housing arrangement comprising:
   a housing enclosing a first interior space suitable for accommodating components capable of forming sources of ignition;
   a pressure relief volume delimited within the first interior space by a partial housing enclosing a second interior space;
   a passage opening connecting the first interior space with the pressure relief volume; and
   a gas-permeable and flame-arresting arrangement arranged in or on the passage opening.

2. The housing arrangement according to claim 1, wherein the partial housing does not share any walls with the housing.

3. The housing arrangement according to claim 1, wherein the passage opening forms at least one wall surface of the partial housing.

4. The housing arrangement according to claim 1, wherein the pressure relief volume is delimited, outside of the first interior space enclosed by the housing, by the partial housing with respect to a surrounding atmosphere.

5. The housing arrangement according to claim 4, wherein the partial housing has openings toward the surrounding atmosphere.

6. The housing arrangement according to claim 4, wherein the partial housing is of a protection class which is different from protection class ex-d.

7. The housing arrangement according to claim 1, wherein the housing has at least one wall which encloses at least one hollow space which forms the pressure relief volume.

8. The housing arrangement according to claim 7, wherein the housing has an inner wall and an outer wall, which, together, enclose at least one hollow space and are connected together in at least one location.

9. The housing arrangement according to claim 4, wherein the surrounding atmosphere is the first interior space.

10. The housing arrangement according to claim 1, wherein all sides of the housing are separated from the partial housing by the first interior space.

* * * * *